US011929759B2

United States Patent
Fröhlich

(10) Patent No.: US 11,929,759 B2
(45) Date of Patent: Mar. 12, 2024

(54) DIGITAL-TO-ANALOG CONVERTER AND METHOD FOR DIGITAL-TO-ANALOG CONVERSION

(71) Applicant: ams International AG, Jona (CH)

(72) Inventor: Thomas Fröhlich, Ottikon Bei Kemptthal (CH)

(73) Assignee: AMS INTERNATIONAL AG, Jona (CH)

( * ) Notice: Subject to any disclaimer, the term of this patent is extended or adjusted under 35 U.S.C. 154(b) by 145 days.

(21) Appl. No.: 17/789,636

(22) PCT Filed: Dec. 14, 2020

(86) PCT No.: PCT/EP2020/085995
§ 371 (c)(1),
(2) Date: Jun. 28, 2022

(87) PCT Pub. No.: WO2021/136645
PCT Pub. Date: Jul. 8, 2021

(65) Prior Publication Data
US 2023/0046938 A1 Feb. 16, 2023

(30) Foreign Application Priority Data
Dec. 30, 2019 (EP) .................................... 19219980

(51) Int. Cl.
*H03M 1/46* (2006.01)
*H03M 1/72* (2006.01)

(52) U.S. Cl.
CPC ............... *H03M 1/46* (2013.01); *H03M 1/72* (2013.01)

(58) Field of Classification Search
CPC ............ H03M 1/06; H03M 1/46; H03M 1/72; H03M 3/04
See application file for complete search history.

(56) References Cited

U.S. PATENT DOCUMENTS 6,266,002 B1 * 7/2001 Gong .................. H03M 1/0668
341/150
6,535,154 B1 * 3/2003 Sculley ............... H03M 1/0668
341/118

(Continued)

FOREIGN PATENT DOCUMENTS

JP  2016213599 A  12/2016

OTHER PUBLICATIONS

Liu et al., "A 105-dB SNDR, 10 kSps Multi-Level Second-Order Incremental Converter with Smart-DEM Consuming 280 pW and 3.3-V Supply", IEEE, 2013, 4 pages.
Chae et al., "A 6.3 μW 20 bit Incremental Zoom-ADC with 6 ppm INL and 1 μV Offset", IEEE Journal of Solid-State Circuits, vol. 48, No. 12, Dec. 2013, 9 pages.

(Continued)

Primary Examiner — Lam T Mai
(74) Attorney, Agent, or Firm — MH2 TECHNOLOGY LAW GROUP LLP

(57) ABSTRACT

A DAC, for use in an iADC, is configured for converting a multi-bit word to an analog feedback signal. The DAC comprises a MMS logic block. It further comprises a plurality of output elements configured to generate respective analog portions based on a selection vector and a signal combiner for combining the analog portions to the analog feedback signal. In the MMS logic block switching blocks are arranged cascaded. Each switching block receives at least a portion of the multi-bit word, splits the portion into two sub-portions and forwards them to one subsequent switching block or to one output element. A weight factor is adjusted by multiplying it with the difference of the two sub-portions. A weight accumulator accumulates successive adjusted weight factors, wherein the way of splitting the portion of a further multi-bit word is determined based on the sign of the weight accumulator.

20 Claims, 8 Drawing Sheets

(56) References Cited

U.S. PATENT DOCUMENTS

| | | | |
|---|---|---|---|
| 6,535,155 B2* | 3/2003 | Ruha | H03M 1/067 |
| | | | 341/120 |
| 6,784,814 B1* | 8/2004 | Nair | H03M 1/0641 |
| | | | 341/120 |
| 9,941,897 B1* | 4/2018 | Li | H03M 1/201 |
| 2002/0126034 A1 | 9/2002 | Draxelmayr | |
| 2003/0001764 A1* | 1/2003 | Ruha | H03M 1/067 |
| | | | 341/144 |
| 2006/0227027 A1* | 10/2006 | Doerrer | H03M 1/0668 |
| | | | 341/143 |
| 2007/0241950 A1* | 10/2007 | Petilli | H03M 1/0663 |
| | | | 341/143 |
| 2009/0296858 A1* | 12/2009 | Nozawa | H04L 25/49 |
| | | | 341/63 |

OTHER PUBLICATIONS

Márkus et al., "Theory and Applications of Incremental ΔΣ Converters", IEEE Transactions on Circuits and Systems—I: Regular Papers, vol. 51, No. 4, Apr. 2004, 14 pages.

Galton, "Spectral Shaping of Circuit Errors in Digital-to-Analog Converters", IEEE Transactions on Circuits and Systems—II: Analog and Digital Signal Processing, vol. 44, No. 10, Oct. 1997, 10 pages.

Norsworthy, "Delta-Sigma Data Converters: Theory, Design, and Simulation", ISBN: 0-7803-1045-4, 9 pages.

Liu "Multibit A/D Converters With High Resolution and Lowpower—A Ph.D. Thesis", University of Pavia, 2013.

International Search Report and Written Opinion in corresponding International Application No. PCT/EP2020/085995, dated Mar. 17, 2021, 17 pages.

* cited by examiner

FIG 3

$$s[n] = \begin{pmatrix} x_1[n] \\ x_2[n] \\ x_3[n] \\ x_4[n] \\ x_5[n] \\ x_6[n] \\ x_7[n] \\ x_8[n] \\ \ldots \end{pmatrix}$$

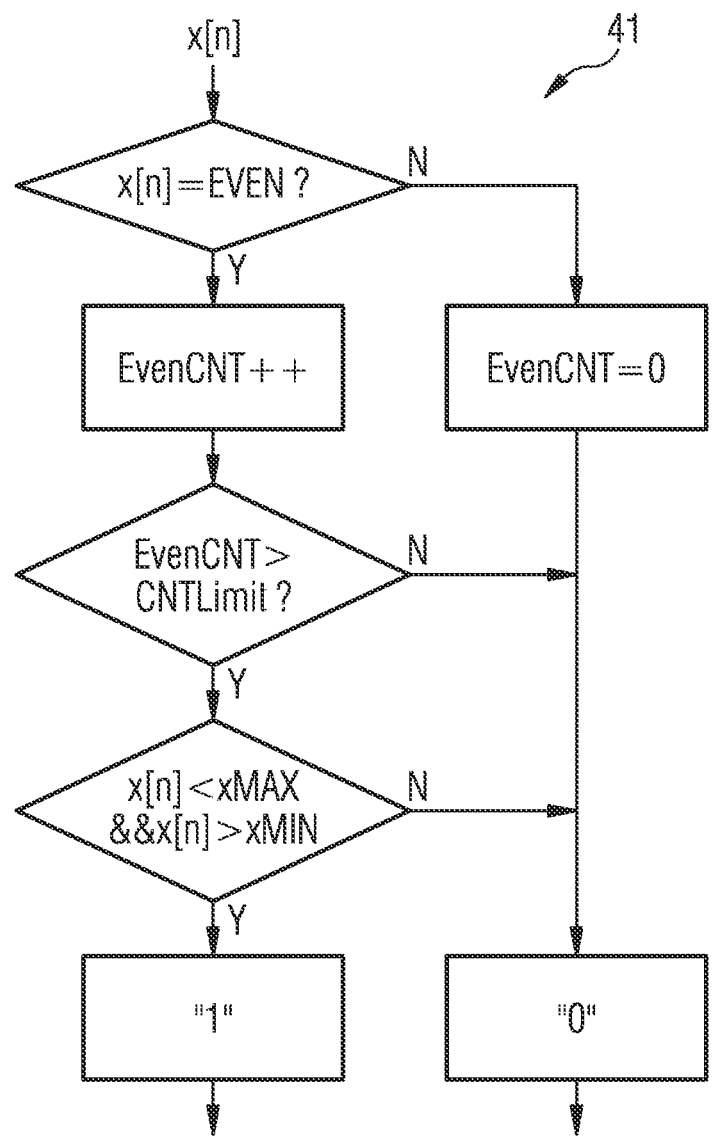

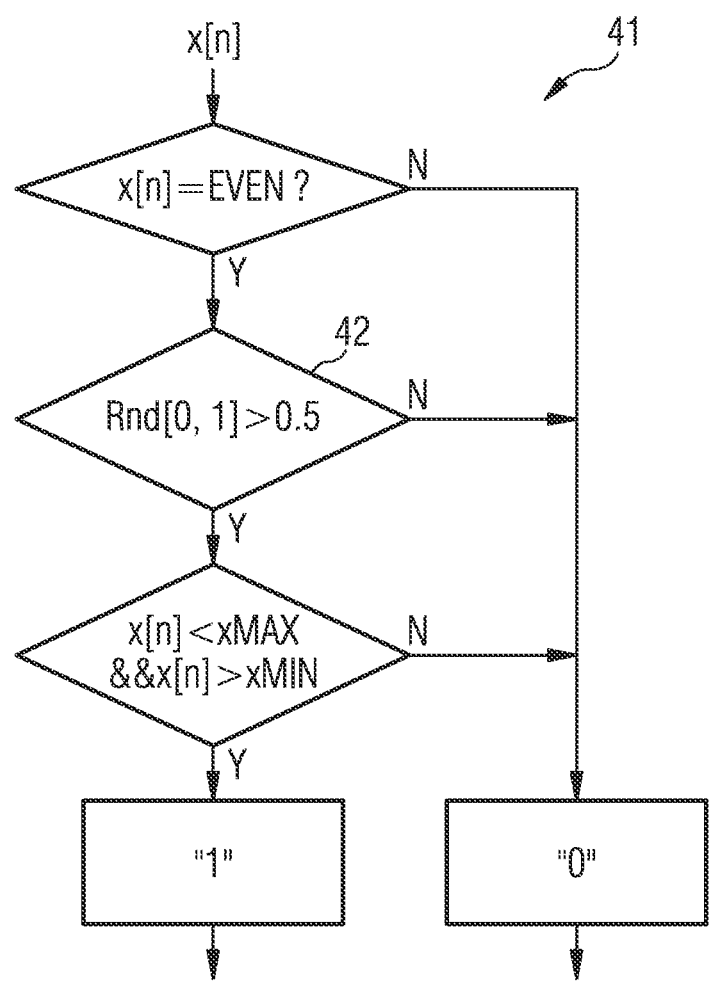

DIGITAL-TO-ANALOG CONVERTER AND METHOD FOR DIGITAL-TO-ANALOG CONVERSION

CROSS-REFERENCE TO RELATED APPLICATIONS

The present application is the national stage entry of International Patent Application No. PCT/EP2020/085995, filed on Dec. 14, 2020, and published as WO 2021/136645 A1 on Jul. 8, 2021, which claims the benefit of priority of European Patent Application No. 19219980.0, filed on Dec. 30, 2019, all of which are incorporated by reference herein in their entireties.

FIELD OF THE INVENTION

The present disclosure relates to a digital-to-analog converter for use in in an incremental analog-to-digital converter, an incremental analog-to-digital converter, an electronic device and a method for digital-to-analog conversion.

BACKGROUND OF THE INVENTION

Incremental analog-to-digital converters (iADCs) are used in many applications where large dynamic range analog signals need to be converted into the digital domain. iADCs are oversampled noise shaping converters and comprise a digital-to-analog converter (DAC) in their feedback loop. iADCs may also be called incremental sigma-delta analog-to-digital converters, or incremental S/D ADCs.

As a fundamental property of noise shaping converters, the DAC resolution can be smaller than the output data word resolution after filtering. However, DAC linearity determines the linearity of the conversion and thus single bit DACs have been widely used in the past for high resolution converters. Single bit DACs are inherently linear. However, with scaled technologies and the resulting lower supply voltages, the quantization noise of single bit DACs start to become a limiting factor for the signal swing at the output of the loop filter integrators.

Multibit DAC designs can help to alleviate the issue, as every increase in the bit width of the DAC reduces the signal swing by a factor of 2. For high resolution multibit DAC designs with more than about 72 dB dynamic range, inherent matching of DAC units is not sufficient to guarantee DAC linearity and therefore dynamic element matching properties are employed to make the DAC linear by shaping the mismatch out of signal band.

For the stability of the iADC's noise shaping loop it is important that the delay between quantizer decision and DAC output is kept as minimal as possible. Since the mismatch shaping (MMS) circuit for the DAC is part of the loop it contributes to the overall delay. Besides, the MMS circuit contributes to the overall hardware complexity of the iADC. Complicated decimation filters and high speed clock requirements can be necessary.

It is an objective to provide a digital-to-analog converter with a fast and hardware efficient implementation for MMS. It is further an objective to provide a method for digital-to-analog conversion with a fast and hardware efficient implementation for MMS.

This objective is achieved with the independent claims. Further embodiments and variants derive from dependent claims. The definitions as described above also apply to the following description unless otherwise stated.

SUMMARY OF THE INVENTION

In one embodiment of a digital-to-analog converter, DAC, the DAC is used in an incremental analog-to-digital converter, iADC. The DAC is arranged in the feedback loop of the iADC and is configured to convert a multi-bit word to an analog feedback signal. In each clock period within the conversion cycle of the iADC, a new multi-bit word is forwarded to the DAC. The multi-bit word represents an integer within a range of integers. The range of represented integers depends on the number of bits of the multi-bit word. The range of integers can cover $2^m+1$ different integers, where m is natural number. Thus, the multi-bit word has m+1 bits. By way of example, the multi-bit word can represent an integer in the range from −4 to +4, thus covering 9 different integer values. In this case, the multi-bit word comprises 4 bits.

The analog feedback signal of the DAC can be any analog signal. By way of example, the analog feedback signal can be a voltage, a current or an electric charge. The analog feedback signal has nominal discrete values depending on the integer represented by the multi-bit word.

The DAC comprises a mismatch shaping logic block. The mismatch shaping logic block is configured to generate a selection vector with a predefined number of bits based on the multi-bit word. If the multi-bit word represents integers within a range of integers comprising $2^m+1$ different integer values, the predefined number of bits of the selection vector can be $2^m$. For example, if a multi-bit word comprising 4 bits represents integers in the range from −4 to +4, the predefined number of bits of the selection vector can be 8.

The DAC further comprises a plurality of output elements. The output elements are configured to generate respective analog portions based on the selection vector. The number of output elements is the same as the number of bits of the selection vector. For example, if the predefined number of bits of the selection vector is 8, there are 8 output elements. Each bit of the selection vector is associated with a corresponding output element. Each output element generates an analog portion if the corresponding bit of the selection vector is active. If the corresponding bit of the selection vector is inactive, the output element generates no analog portion or an analog portion of opposite sign. Furthermore, the analog portions have the same physical unit as the analog feedback signal. This means that if the analog feedback signal is a voltage, the analog portions are also voltages, for example. All output elements are designed to generate the same nominal analog portion. However, due to the fabrication process, all output elements generate a nominal analog portion plus an inherent mismatch error. The output elements can be 1-bit DACs, for example.

The DAC further comprises a signal combiner. The signal combiner is provided for combining the analog portions generated by the output elements to the analog feedback signal. The signal combiner sums up all analog portions coming from the output elements. For example, if the analog portions are electric currents or electric charges, the signal combiner can be a vertex of wires coming from the output elements.

The mismatch shaping logic block comprises a predetermined number of switching blocks. The number of switching blocks is based on the number of output elements and thus also based on the number of bits of the multi-bit word. If the number of output elements is $2^m$, the number of switching blocks is $2^m-1$. For example, if the number of output elements is 8, there are 7 switching blocks.

Each switching block comprises a first input for receiving a signal and a first and second output for forwarding signals. The switching blocks are arranged cascaded. This means that the switching blocks can be arranged in numbered layers. A first layer of switching blocks comprises one switching block receiving the multi-bit word. The two outputs of the switching block of the first layer can be connected to the first respective inputs of switching blocks of a second layer. Similarly, the outputs of the switching blocks of the second layer can be connected to the first inputs of switching blocks of a third layer, and so on. This means that the number of switching blocks are doubled from layer to layer. The outputs of the switching blocks of the last layer are connected to the output elements. The number of layers of switching blocks depends on the number of bits of the multi-bit word. A multi-bit word comprising m+1 bits leads to m layers. For example, if the multi-bit word comprises 2 bits, only 1 layer of switching blocks, i.e. only one switching block, exists. Then, the outputs of the one switching block are directly connected to the output elements, i.e. 2 output elements in this case. Generally, each output of a switching block in a certain layer in connected to a respective input of a switching block of a subsequent layer or to an output element.

Each switching block is configured to receive at least a portion of the multi-bit word, to split the portion into two sub-portions and to forward each sub-portion to one further subsequent switching block or to one of the output elements, respectively. Each switching block receives at least a portion of the multi-bit word via the first input. Each switching block forwards a sub-portion of the multi-bit word via the respective output towards a subsequent switching block or to one of the output elements. The first switching block, i.e. the switching block of the first layer, receives the full multi-bit word. Subsequent switching blocks receive portions or sub-portions of the multi-bit word, respectively. The splitting of the portion of the multi-bit word is configured in such a way that the two sub-portions together add up to the portion of the multi-bit word. Splitting of the multi-bit word portion can be equal or unequal. This means that the two sub-portions can have an equal value or an unequal value. In particular, if the portion of the multi-bit word represents an odd integer, the two sub-portions have an unequal value. For example, if the portion of the multi-bit word is the 4-bit expression "0111", representing the integer 7, it can be split into "011" and "100" or vice versa, representing the numbers 3 and 4, respectively.

In each switching block a weight factor is adjusted by multiplying the weight factor with the difference of the two sub-portions. The weight factor can be a number represented by a further multi-bit word. The weight factor can be forwarded to each switching block. The weight factor can be the same for each switching block. In each clock period within the conversion cycle of the iADC, a new weight factor is provided. The weight factor can vary with each clock period within the conversion cycle of the iADC. An adjusted weight factor is the original weight factor multiplied with the difference between the two sub-portions split from the portion of the multi-bit word.

Each switching block comprises a weight accumulator provided for accumulating successive adjusted weight factors. This means that successive adjusted weight factors are summed up by the weight accumulator. The accumulated adjusted weight factors can be stored in a register. The sum of the adjusted weight factors can have a positive or a negative sign, depending on the preceding adjusted weight factors. Based on the sign of the accumulator it is determined, in which way the portion of a further multi-bit word coming to the respective switching block at a subsequent clock period within the conversion cycle of the iADC is split.

This means that, in the case of unequal splitting of the multi-bit word portion, either the first sub-portion or the second sub-portion is chosen to be larger than the respective other. For example, if the portion of the multi-bit word being "0111" is split into the sub-portions "011" and "100", it can be determined based on the sign of the weight accumulator, which sub-portion becomes "011" and which sub-portion becomes "100". Adding an adjusted weight factor to the weight accumulator can be done later than determining the way of splitting of a current multi-bit word portion. Up to the last clock period within the conversion cycle of the iADC the weight accumulator can converge to 0. When the weight accumulator of each switching block has been converged to 0, the mismatch error has converged to 0, too.

By means of the mismatch shaping logic block comprising the switching blocks MMS is achieved. As described above, each output element generates a nominal analog portion plus an inherent mismatch error, which affects the linearity of the DAC. By generating a selection vector for activating respective output elements, the overall mismatch error can be alleviated or even canceled, which improves the linearity of the DAC. The MMS logic provides activation of the output elements in an appropriate alternate way.

In general, the iADC comprises a decimation filter. For a power efficient implementation, the decimation filter of the iADC is a cascade of integrators. With this approach, the error of the sample conversion of the first clock period is weighted much higher than the error of the sample conversion of the last clock period in case the order of the iADC is higher than one. The MMS logic as described above takes this into account by providing weight factors. This means that the mismatch shaping logic achieves a weighted distribution of output element activation.

Besides, the MMS logic as described above can be implemented in a very hardware efficient way. The circuit complexity of the MMS logic block can be low, i.e. the gate count can be small. There is no high speed clock requirement for the MMS logic block, which can run at the same clock speed as the iADC. This also means that the latency of the mismatch shaping logic block can be kept very low. Additionally, no complicated decimation filter or no decimation filter, which needs a higher oversampling ratio (OSR) than fundamentally necessary, is needed.

The way of splitting a portion of the multi-bit word defines the ratio between the resulting sub-portions. In particular, it determines whether one of the sub-portions becomes larger than the other, and if so, which and by what amount. The splitting is conducted by the switching block or by components comprised by the switching block.

According to at least some implementations, splitting of the multi-bit word or of a portion of the multi-bit word is conducted in one or more steps. This means that the two sub-portions can be created directly by splitting the portion. However, it is also possible that preliminary sub-portions are generated first, which are then further adjusted resulting in the actual sub-portions.

Thus, the switching block can comprise one or more operators that are provided to generate the two sub-portions. For example, the switching block comprises dividing, multiplying, adding and/or subtracting means in order to process the inputted multi-bit word or the portion of the multi-bit word, respectively.

In some embodiments, each switching block comprises a divider and an optional adder. The divider can be formed as a right shift operator. The adder can be formed as a sum operator to add a remainder, e.g. a least significant bit (LSB), to one of the preliminary sub-portions. However, different implementations are also possible.

In other words, the preliminary sup-portions are generated by the divider. Possibly, a remainder is added to or subtracted from a preliminary sub-portion, leading to one of the actual sub-portions. This means that the sub-portion may be an altered version of the preliminary sub-portion. By modifying the preliminary sub-portions, the actual sub-portions are formed. The sub-portions may also called resulting sub-portions. The resulting sub-portions of a switching block are forwarded to a subsequent switching block or to one of the output elements, respectively. However, it is possible that a preliminary sub-portion equals a resulting sub-portion. This is the case, for example, if no remainder is added to or subtracted from the preliminary sub-portion or if the remainder is zero.

In some embodiments, in each clock period within the conversion cycle of the iADC, a new weight factor is provided, wherein successive weight factors decrease according to a monotonically decreasing function. This means that a weight factor of one clock period is equal as or smaller than a weight factor of a respective preceding clock period. Successive weight factors may decrease according to a predefined function, e.g. a quadratic function. The weight factors may be provided for all switching blocks in common. The weight factors can be provided by a weight generator. The weight generator can comprise a memory element storing the weight factors for each clock period. This means that the weight factors may be hard coded on the memory element. Alternatively, the weight generator functions as described below.

According to some implementations, the weight accumulator is reset after each conversion cycle.

In an embodiment each switching block further comprises a second input for providing the weight factor. The weight factor can be a number represented by a further multi-bit word. The weight factor can be forwarded to each switching block simultaneously. The weight factor can be the same for each switching block. At each clock period within the conversion cycle of the iADC, a new weight factor is provided. The weight factor can vary with each clock period within the conversion cycle of the iADC.

In some embodiments, each switching block further comprises a third input for providing a clock signal, the clock signal being provided for the weight accumulator to accumulate subsequent adjusted weight factors. The accumulation of subsequent adjusted weight factors can be conducted in each switching block at the same time. The clock signal can be such that adding an adjusted weight factor to the weight accumulator is conducted later than determining the way of splitting of a current multi-bit word portion.

In some embodiments, each switching block further comprises a detector being configured to detect, if an integer represented by the portion of the multi-bit word reaching the switching block is even or odd. This means that the detector checks if the represented integer can be divided by 2 without residue. In case there is no residue after division by 2, the integer is even. In case there is a residue after division by 2, the integer is odd.

In some embodiments, each switching block further comprises a divider being configured to split the portion of the multi-bit word into two preliminary sub-portions, the preliminary sub-portions having a smaller absolute value than the portion of the multi-bit word. Also, the preliminary sub-portions have less bits than the portion of the multi-bit word.

In some embodiments, each switching blocks further comprises a selector being configured to select one of the preliminary sub-portions, the selection being based on the sign of the weight accumulator. For example, if the sign of the weight accumulator is positive, the first preliminary sub-portion is selected and if the sign of the weight accumulator is negative the second preliminary sub-portion is selected or vice versa.

In some embodiments, each switching block further comprises an adder being configured to add a remainder of the splitting conducted by the divider to the preliminary sub-portion selected by the selector. By adding the remainder of the splitting of the multi-bit word portion to one of the preliminary sub-portions, the two resulting sub-portions together add up to the multi-bit word portion. Besides, by adding the remainder of the splitting of the multi-bit word portion to one of the preliminary sub-portions, one of the sub-portions becomes larger. Which one of the sub-portions becomes larger is determined by the selector based on the sign of the weight accumulator. In case that there is no remainder nothing is added to the preliminary sub-portions. Due to the algorithm in each switching block the two resulting sub-portions of the multi-bit word can have an equal value or an unequal value. In particular, if the portion of the multi-bit word represents an even integer, the two sub-portions can have an equal value. If the portion of the multi-bit word represents an odd integer, the two sub-portions have an unequal value. In case of unequal values of the two sub-portions the selector determines based on the sign of the weight accumulator which sub-portion has to be larger than the other.

Typically, each switching block is realized by hardware components. However, switching blocks can also be realized by a software implementation.

By means of the splitting algorithm the multi-bit word can be reduced to a plurality of single-bit words. In particular, each of the two sub-portions can comprise one bit less than the portion of the multi-bit word. If the output elements are 1-bit DACs, each sub-portion of the multi-bit word, which is forwarded to a respective output element by the last layer of switching blocks, comprises 1 bit. Besides, by use of a selector being based on a weight accumulator each of the output elements are triggered as frequently as required to alleviate or cancel the mismatch error.

In a further embodiment an additional offset is added to the weight accumulator before sign is taken to control the selector. The offset can be a random or pseudo-random number. Thus, the offset leaves the sign of the weight accumulator unchanged or changes the sign of the weight accumulator. Thus, the selection of the selector, to which of the preliminary sub-portions the remainder is added, can be affected by the offset.

If the offset is reasonably small it will not impact the performance of the circuit. By use of an additional offset periodic noise patterns can be reduced.

In an embodiment the divider of each switching block is configured to split the portion of the multi-bit word into two preliminary sub-portions of equal value. Splitting can be done by right-shifting the bits of the multi-bit word and assigning the result to both preliminary sub-portions. This means that, if the portion of the multi-bit word represents an even integer, the divider divides the integer by 2 and assigns the result to both preliminary sub-portions. This way, two equal sub-portions are provided and a remainder of 0 is left from this division. However, if the portion of the multi-bit word represents an odd integer, the divider divides the integer by 2, rounds down the result and assigns it to both preliminary sub-portions. This way, two equal preliminary sub-portions are provided, but a remainder of 1 is left from this division.

In some embodiments, the adder of each switching block is configured to add the remainder of the division conducted by the divider to the preliminary sub-portion selected by the selector. As described above, in case that the portion of the multi-bit word represents an even integer, the remainder is 0. In case that the portion of the multi-bit word represents an odd integer, the remainder is 1. By adding the remainder of the splitting of the multi-bit word portion to one of the preliminary sub-portions, the two resulting sub-portions together add up to the multi-bit word portion.

By means of this splitting logic, the implementation of the switching block is further simplified. This means that the complexity of the MMS logic block can be reduced. By the reduction of circuit complexity also the latency of the MMS logic block can be decreased.

In an embodiment the first switching block, i.e. the switching block receiving the full multi-bit word, comprises a further detector, the further detector being configured to detect a sequence of multi-bit words representing even integers, which are larger than the minimum and smaller than the maximum integer within the range of integer. This is equivalent to integers not being the minimum or maximum integer within the range of integers. Herein, the multi-bit words are submitted to the switching block at different clock periods of the conversion cycle of the iADC. A sequence of multi-bit words representing even integers can comprise at least two successive multi-bit words representing even integers.

For each r-th multi-bit word of the detected sequence the adder of the first switching block is configured to add a unit to one of the two preliminary sub-portions. A subtractor is configured to subtract the unit from the other preliminary sub-portion. r is a natural number. For example, r can be 2. The selector determines the respective preliminary sub-portions, i.e. the preliminary sub-portion the unit has to be add to and the preliminary sub-portion the unit has to be subtract from, based on the sign of the weight accumulator.

For example, if the 4-bit expression "0110", which represents the integer 6, is the r-th multi-bit word of a detected sequence, the two resulting sub-portions can be the 3-bit expressions "010" and "100", representing the numbers 2 and 4, respectively. Thus, the multi-bit word representing an even integer is effectively split into two sub-portions of unequal value. The weight factor has to be adjusted by multiplying it with the difference of the two sub-portions, i.e. +2 or −2, respectively.

In a further embodiment at least two switching blocks comprise a further detector, the further detector being configured to detect a sequence of multi-bit words representing even integers, which are not the minimum or maximum integer within the range of integers. For each r-th multi-bit word of the detected sequence, where r is a natural number, the adder is configured to add a unit to one of the two preliminary sub-portions and a subtractor is configured to subtract the unit from the other preliminary sub-portion, wherein the selector determines the respective preliminary sub-portions based on the sign of the weight accumulator. Thus, the multi-bit word representing an even integer is effectively split into two sub-portions of unequal value.

By detecting sequences of multi-bit words representing even integers and by splitting each r-th multi-bit word of the detected sequence, which does not represent the minimum or maximum integer within the range of integers, into two portions of unequal value, the convergence time of the MMS logic can be reduced, which means that the mismatch error is alleviated faster.

In an embodiment the first switching block, i.e. the switching block receiving the full multi-bit word, comprises a further detector, the further detector being configured to detect multi-bit words representing even integers, which are not the minimum or maximum integer within the range of integers.

The first switching block further comprises a ditherer, wherein the ditherer determines by random to split a multi-bit word detected by the further detector into two portions of equal or unequal value, respectively. For example, the ditherer generates a random number centered around 0 and determines based on the sign of the random number how to split the even multi-bit word.

In case that the ditherer determines unequal splitting, the adder of the first switching block is configured to add a unit to one of the two preliminary sub-portions. A subtractor is configured to subtract the unit from the other preliminary sub-portion.

The selector determines the respective preliminary sub-portions, i.e. the preliminary sub-portion where the unit has to be add to and the preliminary sub-portion where the unit has to be subtract from, based on the sign of the weight accumulator. Thus, the multi-bit word representing an even integer is effectively split into two sub-portions of unequal value.

In a further embodiment at least two switching blocks comprise a further detector, the further detector being configured to detect multi-bit words representing even integers, which are not the minimum or maximum integer within the range of integers. The at least two switching blocks further comprise a ditherer, wherein the ditherer determines by random to split an even multi-bit word detected by the further detector into two portions of equal or unequal value, respectively. The adder of the at least two switching blocks is configured to add a unit to one of the two preliminary sub-portions and a subtractor is configured to subtract the unit from the other preliminary sub-portion, wherein the selector determines the respective preliminary sub-portions based on the sign of the weight accumulator. Thus, the multi-bit word representing an even integer is effectively split into two sub-portions of unequal value.

By detecting multi-bit words representing even integers and determining by random to split an even multi-bit word into two portions of equal or unequal value the convergence time of the MMS logic can be reduced, which means that the mismatch error can be canceled faster.

In an embodiment the DAC further comprises a weight generator, the weight generator being configured to provide successive weight factors for each clock period within the conversion cycle of the iADC. The weight factor can be a number represented by a further multi-bit word. The weight factors are generated for all switching blocks in common. The weight factor can be the same for each switching block at a given clock period. In each clock period within the conversion cycle of the iADC, a new weight factor is provided.

The weight factor can vary with each clock period within the conversion cycle of the iADC or it can stay constant. In particular, the weight generator generates monotonically decreasing weight factors for subsequent clock periods.

The weight factors can decrease according to a predefined function. The predefined function can be based on the amount of integration stages of the weight generator. Typically, the weight factors are generated by the same amount of integration stages as the amount of integration stages in the iADC's decimation filter in order to match the weighting of the DAC and the decimation filter. The weight factors are therefore decaying with a quadratic curve in case of a second order decimation filter or with a cubic curve in case of a third order decimation filter.

Typically for an iADC, the total number of clock periods within the conversion cycle is the OSR. The weight factor of the last clock period within the conversion cycle of the iADC has to be 1, whereas the weight factor of the first clock period within the conversion cycle of the iADC is the largest one. Theoretically, the weight factor W of the first clock period can be calculated by $$W[1] = \frac{OSR!}{(OSR - Z - 1)! \cdot (Z + 1)!},$$

where OSR is the oversampling ratio, Z is the number of integration stages of the weight generator and "!" denotes the factorial function. However, the size, and thus the bit width of the weight factors can be strongly reduced without significant degradation of the signal, leading to smaller values of the weight factors.

Since the weight factors decrease with subsequent clock periods and since in each switching block the weight factors are adjusted by multiplying them with the difference between the two sub-portions of the multi-bit word, wherein the difference can be positive or negative, the weight accumulator converges to 0. As soon as the weight accumulator in each switching block converged to 0, the mismatch error is canceled.

By use of the weight generator, which generates weight factors monotonically decreasing, the fact is considered that in an iADC the first DAC feedback value is weighted much higher than the last feedback value. Due to the MMS logic this weighting is considered for the generation of the selection vector. Each output element is triggered as frequently as required to alleviate or cancel the mismatch error.

In an embodiment the weight generator further comprises a generator input receiving a digital starting factor. The digital starting factor can be a further multi-bit word. The digital starting factor is provided for recursive calculation of successive weight factors according to a predefined function. In one example of this embodiment the digital starting factor is hardcoded in an integration register, which is comprised by the weight generator. In this case, there is no need for a generator input.

In some embodiments, the weight generator further comprises a generator output providing the weight factor. The generator output can be connected to the second inputs of the switching blocks for providing the weight factor. At each clock period of the conversation cycle of the iADC the generator output provides updated weight factors. The generator output provides a weight factor for each switching block in common.

In some embodiments, the weight generator further comprises at least one integration stage coupling the generator input to the generator output. However, the weight generator can comprise more than one integration stages. Typically, the weight generator comprises as much integration stages as integration stages in the iADC's decimation filter in order to match the weighting of the DAC and the decimation filter. However, the weight generator can also comprise more or less integration stages. For example, the weight generator can comprise three integration stages. As described above, in case of three integration stages successive weight factors decay according to a cubic curve.

In some embodiments, each integration stage further comprises a stage input to receive a digital input signal from the generator input or from a preceding integration stage, respectively. Each integration stage further comprises a stage output to provide a digital output signal for a subsequent integration stage or the generator output, respectively. This means that the stage input of a first integration stage is connected to the generator input. The stage inputs of further integration stages are connected to stage outputs of preceding integration stages. The stage output of the last integration stage is connected to the generator output.

In some embodiments, each integration stage further comprises a stage combiner configured to combine the digital input signal and a feedback from the digital output signal. In particular, the stage combiner subtracts the digital input signal from the feedback from the digital output signal.

In some embodiments, each integration stage further comprises a register configured to process the combination of the digital input signal and the feedback from the digital output signal, the register providing the digital output signal.

Typically, the weight generator is realized by a software implementation. However, the weight generator can also be realized by hardware components.

By means of the weight generator, weight factors can be generated, which decrease monotonically. These weight factors can be forwarded to each switching block to support the MMS logic, which includes a weighting algorithm. With the amount of integration stages the predefined function, according to which the weight factors decrease, can be controlled.

In an embodiment the weight generator forwards the respective weight factor for a given clock period of the conversion cycle to each switching block. Herein, the generator output, which provides the weight factors, is connected to the second inputs of each switching block. At each clock period of the conversation cycle of the iADC the generator output provides different weight factors. The generator output provides a weight factor for each switching block in common.

Due to the fact that each switching block can work with the same weight factor, the circuit complexity can be further simplified.

In an embodiment the DAC is incorporated in an iADC. The iADC further comprises an input for providing an analog input signal. The analog input signal can be any analog signal, for example an electric current, a voltage, or an electric charge.

In some embodiments, the iADC further comprises a combiner being configured to combine the analog input signal with the analog feedback signal from the DAC. The analog feedback signal from the DAC has the same physical unit as the analog input signal. If, for example, the analog input signal is a voltage, the analog feedback signal from the DAC is a voltage, too. The combiner of the iADC is connected to the input of the iADC as well as to the signal combiner of the DAC.

In some embodiments, the iADC further comprises a loop filter being configured for filtering a combination of the analog input signal and the analog feedback signal. Loop filters for incremental analog-to-digital conversion are known to persons skilled in the art. The loop filter can be of higher order.

In some embodiments, the iADC further comprises an N-level quantizer for generating the multi-bit word based on an output of the loop filter. The multi-bit word represents an integer within a range of integers. The range of represented integers depends on the number of bits of the multi-bit word. The N-level quantizer can generate multi-bit words representing at least N different integers, where N is a natural number.

In some embodiments, the iADC further comprises a feedback path comprising the DAC. The DAC is configured to convert the multi-bit word from the N-level quantizer to an analog feedback signal for the combiner of the iADC. The DAC is described in detail above.

In some embodiments, the iADC further comprises a decimation filter provided for filtering the multi-bit word to generate a digital system output signal. Typically, the decimation filter is implemented as a cascade of integrators. The amount of integration stages of the decimation filter can be adjusted to match the amount of integration stages of the weight generator. Decimation filters are known to the skilled person.

The iADC can be used in application where large dynamic range analog signals need to be converted into the digital domain. iADCs are oversampled noise shaping converters and the analog circuit is very similar to sigma-delta (S/D) modulators. Opposed to S/D modulators, iADCs are reset after each conversion and therefore the correlation between conversions is removed. Thanks to this property, the iADC can be used in systems where uncorrelated signals are multiplexed to one single ADC.

In an embodiment the iADC is incorporated in an electronic device. Further, the electronic device is connected to at least one sensor, wherein the iADC is configured to perform an analog-to-digital conversion of the signal provided by the at least one sensor. The sensor can be any environmental sensor, which generates an analog signal, for example a voltage, an electric current or an electric charge. For example, the sensor can be an optical sensor such as a photodiode or an array of photodiodes. The sensor can also be based on a resistance bridge. In an embodiment, the iADC can be a 16-bit analog-to-digital converter with a conversion rate of 100,000 samples per second (100 kSPS).

By use of the iADC in an electronic device connected to at least one sensor, environmental parameters such as electromagnetic radiation can be measured and further processed in a digital circuitry.

In a further embodiment the iADC is incorporated in a current to digital converter integrated circuit, the integrated circuit further comprises a current to voltage converter, where the iADC is configured to convert the output of the current to voltage converter to a digital representation.

By use of a current to digital converter an electric current can be converted to a voltage signal, which in turn can be converted to a digital signal.

Furthermore, a method of digital-to-analog conversion is provided. All features described for the digital-to-analog converter are also described for the method of digital-to-analog conversion and vice-versa.

The method of digital-to-analog conversion comprises converting a multi-bit word representing an integer within a range of integers to an analog feedback signal of an incremental analog-to-digital converter, iADC. The method of digital-to-analog conversion further comprises generating a selection vector with a predefined number of bits based on the multi-bit word. Generating the selection vector can be conducted by use of a mismatch shaping logic block comprising a predetermined number of switching blocks. The mismatch shaping logic block and the switching blocks can be implemented by a software.

The method further comprises generating respective analog portions based on the selection vector. Generating the analog portions are conducted by use of a plurality of output elements. The method further comprises combining the analog portions to the analog feedback signal.

The generation of the selection vector further comprises successive splitting of the multi-bit word into portions and sub-portions, respectively. For example, the multi-bit word or the portion of the multi-bit word can be forwarded to a switching block, then the portion is split into two sub-portions and then each sub-portion is forwarded to one further subsequent switching block or to one of the output elements, respectively.

The generation of the selection vector further comprises adjusting of weight factors by multiplying the weight factors with the difference of two respective sub-portions. For example, in each switching block the weight factors are adjusted by multiplying them with the difference of the two sub-portions generated in the respective switching block.

Successive adjusted weight factor are accumulated. Based on the sign of the accumulation of adjusted factors the way is determined, how to split portions of further multi-bit words at subsequent clock periods within the conversion cycle of the iADC. For example, in each switching block the adjusted weight factors can be accumulated in a weight accumulator. Like the switching block the weight accumulator can be implemented by a software.

By this method of digital-to-analog conversion MMS is achieved. By generating a selection vector for activating respective output elements, the overall mismatch error can be alleviated or even canceled, which improves the linearity of the DAC. Besides, by including a weighting algorithm to the MMS, the fact is taken into account that the error of the sample conversion of the first clock period is weighted much higher than the error of the sample conversion of the last clock period. The method is easy to implement and can be performed fast. This means that the latency can be kept very low.

In a further embodiment, the method further comprises providing a new weight factor in each clock period within the conversion cycle of the iADC. Successive weight factors decrease according to a monotonically decreasing function.

In a further embodiment of the method, the method further comprises generating successive weight factors for each clock period within the conversion cycle of the iADC by use of a weight generator. The weight generator can be implemented by a software. The generation of weight factors further comprises receiving a digital starting factor at a generator input. Alternatively, the digital starting factor can be hardcoded in a register, making the generator input redundant. At least one integration stage is provided, the integration stage coupling the generator input to a generator output. At a stage input of the integration stage, a digital input signal from the generator input or from a preceding integration stage is received. The digital input signal is combined with a feedback from a digital output signal. After processing the combination of the digital input signal and the feedback from the digital output signal, the digital output signal can be provided at the stage output. The digital output signal is provided for a subsequent integration stage or the generator output. The generation of weight factor further comprises providing the weight factors at the generator output.

By generating successive weight factors for each clock period within the conversion cycle of the iADC the fact is considered that in an iADC the first DAC feedback value of the conversion is weighted much higher than the last feedback value of the conversion. The weight factors can be generated according to a predefined function that complements the weighting of the DAC feedback values. For example, the weight factor decrease according to a monotonically decreasing function.

In a further embodiment of the method, it is detected, if the integer represented by the portion of the multi-bit word coming to the respective switching block is even or odd. The portion of the multi-bit word is split into two preliminary sub-portions of equal value. Splitting can be done by a right-shift operation. This means that the represented integer is divided by 2 and rounded down. In case that the integer represented by the multi-bit word was even, a remainder of 0 is left from this division. In case that the integer represented by the multi-bit word was odd, the remainder is 1 instead. Then, one preliminary sub-portion is selected based on the sign of the accumulation of adjusted weight factors. The remainder of the division is added to that preliminary sub-portion, which was selected based on the sign of the accumulation of adjusted weight factors.

By this algorithm it is accomplished that the sub-portions have one bit less than the portion of the multi-bit word, from which they are generated by splitting. Besides, the algorithm is easy to implement and does not consume much time during execution. Due to the selection of one preliminary sub-portion based on the sign of the weight accumulator, the weight of the DAC feedback value at this particular clock period within the conversation cycle of the iADC is considered.

In a further embodiment of the method sequences of multi-bit words representing even integers, which are not the minimum or maximum integer within the range of integers, are detected in the first switching block. Multi-bit words of the sequence reach the switching block at subsequent clock periods within the conversion cycle of the iADC. For each r-th multi-bit word of a detected sequence, where r is a natural number, a unit is added to one of the two preliminary sub-portions and the unit is subtracted from the other preliminary sub-portion, wherein the respective preliminary sub-portions are selected based on the sign of the accumulation of adjusted weight factors. By this algorithm convergence of MMS is achieved faster.

In a further embodiment of the method multi-bit words representing even integers, which are not the minimum or maximum integer within the range of integers, are detected in the first switching block. Also, it is determined by random to split a detected multi-bit word representing an even integer into two portions of equal or unequal value, respectively. In case of determination of unequal splitting, a unit is added to one of the two preliminary sub-portions and the unit is subtracted from the other preliminary sub-portion, wherein the respective preliminary sub-portions are based on the sign of the accumulation of adjusted weight factors. Also by this algorithm convergence of MMS can be achieved faster.

The method may be carried out using a DAC according to one of the implementations described above. Further implementations of the method become readily apparent for the skilled reader from the various embodiments described above for the DAC.

BRIEF DESCRIPTION OF THE DRAWINGS

The improved conversion concept will be described in more detail below for several embodiments with reference to the drawings. Identical reference numerals designate signals, elements or components with identical functions. If signals, elements or components correspond to one another in function, a description of them will not necessarily be repeated in each of the following figures.

FIG. 3 shows a selection vector according to an embodiment of a digital-to-analog converter, DAC.

FIG. 6 shows two flow charts of even value detection according to the embodiment of FIG. 5.

DETAILED DESCRIPTION

Figure 1:
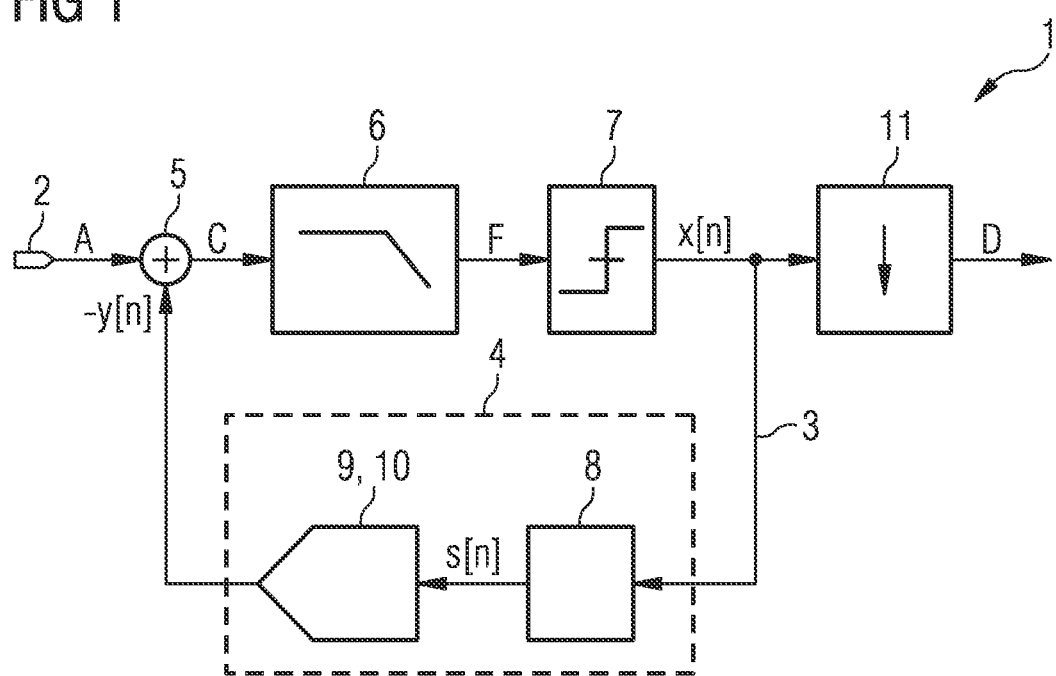
FIG. 1 shows a schematic of an incremental analog-to-digital converter, iADC.

In FIG. 1 a schematic of an incremental analog-to-digital converter, iADC, is shown. Since the functional principal of an iADC is known for one skilled in the art, the schematic is described only roughly.

The iADC 1 comprises an input 2 for providing an analog input signal A. The iADC further comprises a feedback path 3 with a digital-to-analog converter, DAC 4. The DAC 4 provides an analog feedback signal y[n] for each clock period n within the conversion cycle of the iADC. Both analog input signal A and analog feedback signal y[n] are forwarded to a combiner 5 of the iADC 1. The combiner 5 sums up the analog input signal A and the negated analog feedback signal y[n] and forwards the combined signal C to a loop filter 6. This means, the combiner subtracts the analog feedback signal y[n] from the analog input signal A. The loop filter 6 is configured to filter the combined signal C according to known filtering techniques. The filtered signal F is then forwarded to an N-level quantizer 7. The N-level quantizer 7 generates from the filtered signal F a multi-bit word x[n] at each clock period n. The multi-bit word x[n] can represent N different integers, depending on active bits of the multi-bit word, where N is a natural number. The multi-bit word x[n] is forwarded via the feedback path 3 to the DAC 4, which is configured to convert the multi-bit word x[n] into the analog feedback signal y[n].

The DAC 4 within the feedback path 3 comprises a mismatch shaping logic block 8. The mismatch shaping logic block is configured to generate a selection vector s[n] with a predefined number of bits. The number of bits is based on the multi-bit word x[n]. The DAC 4 further comprises a plurality of output elements 9 and a signal combiner 10. The number of output elements 9 corresponds to the number of bits of the selection vector s[n]. The output elements 9 are configured to generate respective analog portions $y_i[n]$ based on the selection vector s[n], where i is the numbering of the output elements 9. This means that each bit of the selection vector s[n] is associated with a corresponding output element 9. Each output element 9 generates an analog portion $y_i[n]$ if the corresponding bit of the selection vector s[n] is active. If the corresponding bit of the selection vector s[n] is inactive, the output element 9 generates no analog portion $y_i[n]$ or an analog portion $y_i[n]$ of opposite sign. The signal combiner 10 combines all analog portions $y_i[n]$ generated by the output elements 9 to the analog feedback signal $y[n]$. This means that the signal combiner 10 sums up all analog portions $y_i[n]$.

The iADC 1 further comprises a decimation filter 11. The decimation filter 11 receives the multi-bit word $x[n]$ of each clock period n within the conversion cycle of the iADC 1. The decimation filter 11 is configured to filter the multi-bit words $x[n]$ in order to generate a digital system output signal D. Filtering techniques, which can be used by the decimation filter 11, are known by the skilled person in general.

Figure 2:
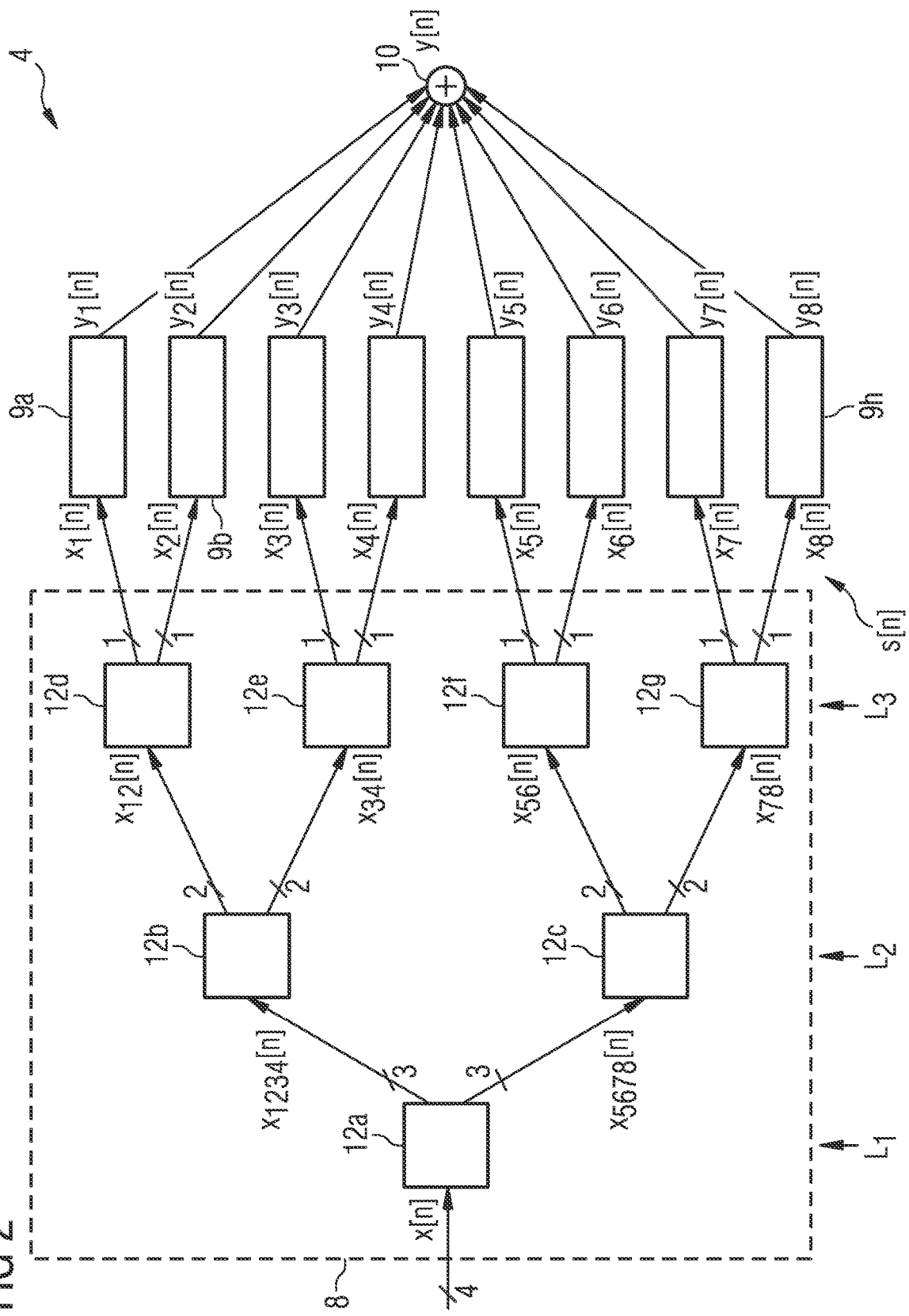
FIG. 2 shows a schematic of an embodiment of a digital-to-analog converter, DAC.

In FIG. 2 a schematic of an embodiment of the DAC 4 is shown. In this example, the DAC 4 has a limited resolution. However, the DAC 4 can be adjusted easily in order to achieve a lower or a higher resolution. Thus, the shown schematic of FIG. 2 has to be understood as an exemplary embodiment without loss of generality.

The DAC 4 comprises several components, namely the mismatch shaping logic block 8, the plurality of output elements 9 and the signal combiner 10. These components are connected by several signals. The mismatch shaping logic block 8 comprises a predetermined number of switching blocks 12, which are arranged cascaded. The number of switching blocks 12 is predetermined by the multi-bit word representing integers within a range of integers. For the same reason the number of output elements 9 is predetermined. In this example, the mismatch shaping logic block 8 comprises seven switching blocks 12*a-g* and eight output elements 9*a-h*.

With the DAC of FIG. 2 it is possible to convert a multi-bit word $x[n]$ representing integers within a range covering nine different integers. The integers covered by the range of integers corresponds to the levels of the N-level quantizer 7. In this example the N-level quantizer 7 is a 9-level quantizer generating a 4-bit word.

The switching blocks 12 are arranged cascaded forming layers of switching blocks $L_j$. The first layer of switching blocks $L_1$ comprises one switching block 12*a*. From layer $L_j$ to layer $L_j+1$ the number of switching blocks 12 is doubled. Thus, in this example, the second layer $L_2$ comprises two switching blocks 12*b-c* and the third layer $L_3$ comprises four switching blocks 12*d-g*.

In FIG. 2, the number of bits of incoming and outgoing signals of each switching block is indicated by numerals next to lines crossing the signal line. The switching block 12*a* of the first layer $L_1$ receives the multi-bit word $x[n]$ coming from the N-level quantizer, which is a 4-bit signal in this case. The multi-bit word $x[n]$ is split by the switching block 12*a* into two portions $x_{1234}[n]$ and $x_{5678}[n]$ of the multi-bit word, which are forwarded to the switching blocks 12*b-c* of the second layer $L_2$. The portions $x_{1234}[n]$ and $x_{5678}[n]$ of the multi-bit word $x[n]$ are 3-bit signals, thus having one bit less than the multi-bit word $x[n]$. In the next step, the portion $x_{1234}[n]$ is split by the switching block 12*b* into the sub-portions $x_{12}[n]$ and $x_{34}[n]$, whereas the portion $x_{5678}[n]$ is split by the switching block 12*c* into the sub-portions $x_{56}[n]$ and $x_{78}[n]$. The sub-portions $x_{12}[n]$, $x_{34}[n]$, $x_{56}[n]$ and $x_{78}[n]$ are 2-bit signals. They are forwarded to the switching blocks 12*d-g* of the third layer $L_3$. The switching block 12*d* splits the sub-portion $x_{12}[n]$ into further sub-portions $x_1[n]$ and $x_2[n]$, both further sub-portions being 1-bit signals. The switching block 12*e* splits the sub-portion $x_{34}[n]$ into the further sub-portions $x_3[n]$ and $x_4[n]$, both further sub-portions being 1-bit signals. The switching block 12*f* splits the sub-portion $x_{56}[n]$ into the further sub-portions $x_5[n]$ and $x_6[n]$, both further sub-portions being 1-bit signals. The switching block 12*g* splits the sub-portion $x_{78}[n]$ into the further sub-portions $x_7[n]$ and $x_8[n]$, both further sub-portions being 1-bit signals.

Each further sub-portion $x_{1-8}[n]$ is a component of the selection vector $s[n]$, as shown in FIG. 3. Each further sub-portion $x_{1-8}[n]$ is forwarded to one respective output element 9*a-h*. The output elements 9 can be 1-bit DACs. The output elements 9 are triggered depending on the selection vector $s[n]$, i.e. the bits of the selection vector comprising the further sub-portion $x_{1-8}[n]$. Each output element 9 generates an analog portion $y_i[n]$ if the corresponding bit, i.e. $x_i[n]$, of the selection vector $s[n]$ is active. If the corresponding bit, i.e. $x_i[n]$, of the selection vector $s[n]$ is inactive, the output element 9 generates no analog portion $y_i[n]$ or an analog portion $y_i[n]$ of opposite sign.

The signal combiner 10 combines all analog portions $y_i[n]$ generated by the output elements 9 to the analog feedback signal $y[n]$. The analog feedback signal $y[n]$ is further forwarded to the combiner 5 of the iADC.

In FIG. 3 an example of the selection vector $s[n]$ is shown. In this example, the selection vector $s[n]$ has at least eight components $x_i[n]$, controlling at least eight output elements 9. In case that the DAC 4 has a higher resolution than the DAC 4 from FIG. 2, the mismatch logic block 8 comprising more than seven switching blocks 12 and more than eight output elements 9. In this case the selection vector $s[n]$ comprises as much components as output elements 9, which is indicated by the dots at the end of the selection vector $s[n]$.

Figure 4:
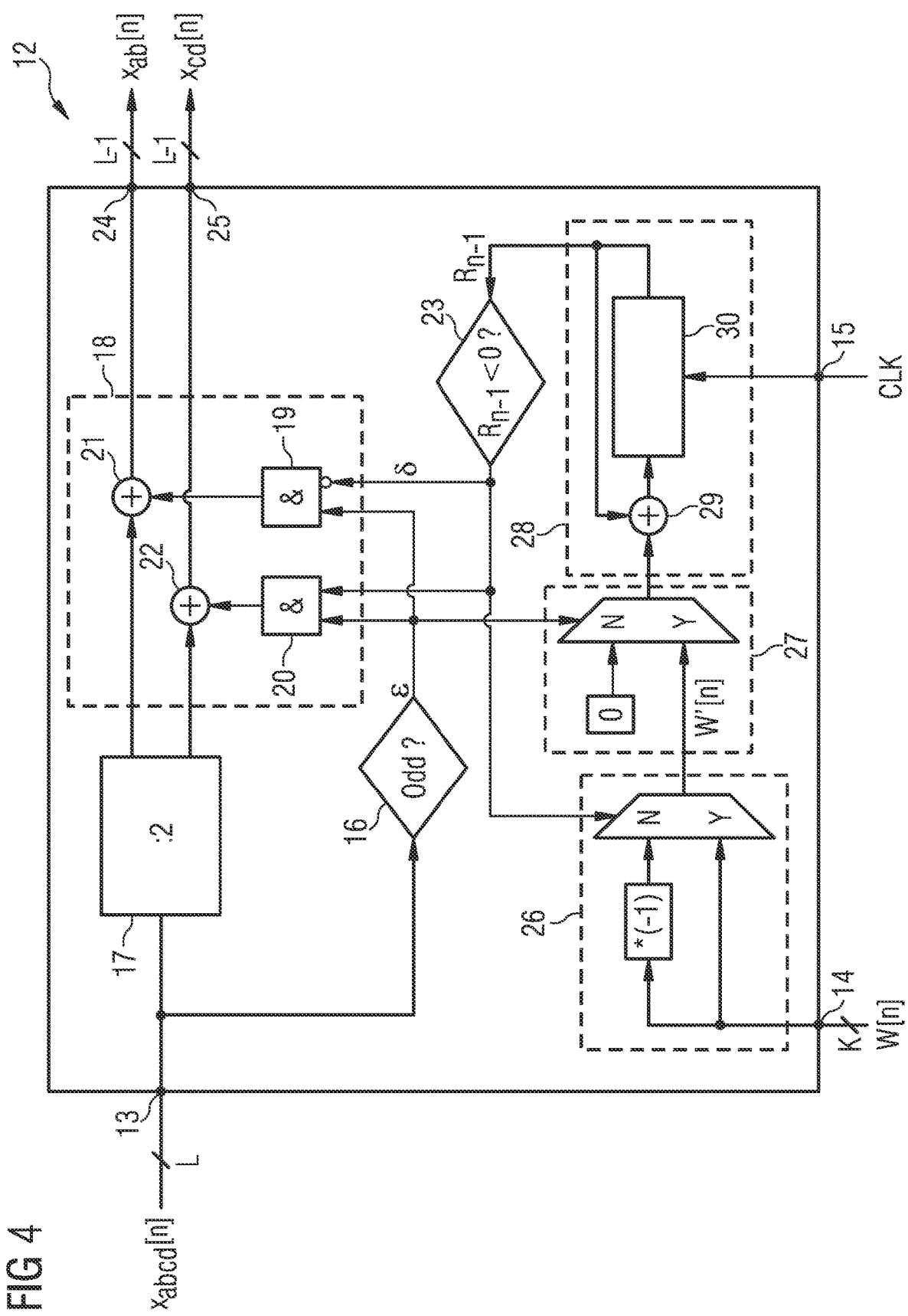
FIG. 4 shows a schematic of a switching block according to an embodiment of a digital-to-analog converter, DAC.

In FIG. 4 a schematic of an exemplary switching block 12 according to an embodiment of the DAC 4 is shown. The switching block 12 shown has to be understood as exemplary embodiment according to the basic idea of the proposed MMS logic. Further implementations of the proposed MMS logic, which are different from FIG. 4 but have the same function, may become readily apparent for the skilled reader.

Furthermore, the switching block 12 shown can be any switching block 12 within the mismatch shaping logic block 8 of the DAC 4. This means that the switching block 12 of FIG. 4 can be arranged in any layer $L_j$ of the mismatch shaping logic block 8. The switching block 12 has a first input 13 for receiving the multi-bit word $x[n]$ or at least a portion $x_k[n]$ of the multi-bit word $x[n]$. Without loss of generality the switching block 12 of FIG. 4 receives an incoming signal, which comprises the portion $x_{abcd}[n]$ of the multi-bit word $x[n]$, and which has L bits, where L is a natural number higher than 1.

The switching block 12 further comprises a second input 14 for providing a weight factor $W[n]$ at each clock period n of the conversion cycle of the iADC 1. The weight factor $W[n]$ can be a signal comprising K bits, where K is natural number. The switching block further comprises a third input 15 for providing a clock signal CLK.

The portion $x_{abcd}[n]$ of the multi-bit word $x[n]$ is forwarded to a detector 16. The detector 16 detects whether the portion $x_{abcd}[n]$ represents an even or an odd integer. If the portion $x_{abcd}[n]$ represents an even integer, the detector 16 outputs "0". Otherwise, if the portion $x_{abcd}[n]$ represents an odd integer, the detector 16 outputs "1". The output of the detector 16 can be understood as remainder ε of a division of the portion $x_{abcd}[n]$.

The portion $x_{abcd}[n]$ of the multi-bit word $x[n]$ is also forwarded to a divider 17. The divider 17 splits the portion $x_{abcd}[n]$ into two equal preliminary sub-portions $x_{ab}[n]$ and $x_{cd}[n]$. The splitting can be done by right-shifting the bits of the portion $x_{abcd}[n]$. This means that the integer represented by the portion $x_{abcd}[n]$ is divided by 2 and rounded down. The result of this division is assigned to both preliminary sub-portions $x_{ab}[n]$ and $x_{cd}[n]$. In case that the portion $x_{abcd}[n]$ represents an even integer, there is a remainder $\varepsilon=0$ left from this division, i.e. the two preliminary sub-portions $x_{ab}[n]$ and $x_{cd}[n]$ together add up to the portion $x_{abcd}[n]$. In case that the portion $x_{abcd}[n]$ represents an odd integer, there is a remainder $\varepsilon=1$ left from this division. This remainder $\varepsilon$ is outputted by the detector 16, as described above.

The switching block 12 further comprises an adder 18. The adder 18 is configured to add the remainder $\varepsilon$ of the division conducted by the divider 17 to one of the preliminary sub-portions $x_{ab}[n]$ or $x_{cd}[n]$. The adder comprises a first AND-gate 19 and a second AND-gate 20. One of the input terminals of the first AND-gate 19 is inverted. The outputted remainder $\varepsilon$ of the detector 16 is forwarded to one input terminal each of both AND-gates 19, 20, which is not inverted. The adder further comprises a first sum operator 21 configured to add the remainder $\varepsilon$ to the first preliminary sub-portion $x_{ab}[n]$. The output of the first AND-gate 19 is connected to the first sum operator 21. The adder further comprises a second sum operator 22 configured to add the remainder $\varepsilon$ to the second preliminary sub-portion $x_{cd}[n]$. The output of the second AND-gate 20 is connected to the second sum operator 22.

The switching block 12 further comprises a selector 23 configured to select one of the preliminary sub-portions $x_{ab}[n]$ or $x_{cd}[n]$, to which the remainder $\varepsilon$ is to be added. Herein, the selection is based on accumulated adjusted weight factors W[n] of preceding clock periods. The selector 23 outputs 0, if the remainder $\varepsilon$ is to be added to the first preliminary sub-portion $x_{ab}[n]$. Instead, the selector 23 outputs 1, if the remainder $\varepsilon$ is to be added to the second preliminary sub-portion $x_{cd}[n]$. The outputted selection signal $\delta$ of the selector 23 is forwarded to the other respective input terminals of the AND-gates 19, 20 of the adder 18. Thus, the selection signal $\delta$ is forwarded to the inverted input terminal of the first AND-gate 19 and to the second input terminal of the second AND-gate 20, which is not inverted.

Only if both input terminals of one of the AND-gates 19, 20 are "1", the respective AND-gate forwards "1" to the corresponding sum operator 21, 22, leading to an addition to the corresponding preliminary sub-portion $x_{ab}[n]$ or $x_{cd}[n]$, respectively. This means that in case that the remainder $\varepsilon$ is "0" there is no addition at all. In case that the remainder $\varepsilon$ is "1" and the selection signal $\delta$ is "0", the first AND-gate is activated since the selection signal $\delta$ is inverted, thus becoming "1". In case that the remainder $\varepsilon$ is "1" and the selection signal $\delta$ is "1", the second AND-gate is activated.

The switching block 12 further comprises a first output 24 forwarding the first sub-portion $x_{ab}[n]$. Additionally, the switching block 12 comprises a second output 25 forwarding the second sub-portion $x_{cd}[n]$. Both sub-portions $x_{ab}[n]$, $x_{cd}[n]$ have L−1 bits, thus having one bit less than the portion $x_{abcd}[n]$ of the multi-bit word x[n]. Furthermore, in case that the portion $x_{abcd}[n]$ represents an even integer, both sub-portions $x_{ab}[n]$, $x_{cd}[n]$ have an equal value. In case that the portion $x_{abcd}[n]$ represents an odd integer, one of the sub-portions $x_{ab}[n]$, $x_{cd}[n]$ is larger by 1 than the corresponding other.

The weight factor W[n] provided by the second input 14 of the switching block 12 is adjusted by multiplying it with the difference between the two outputted sub-portions $x_{ab}[n]$, $x_{cd}[n]$. This is achieved by use of a first logical operator 26 and a second logical operator 27. The first logical operator 26 is connected to the selection signal $\delta$ for evaluating. If the selection signal $\delta$ is "0", the weight factor W[n] is multiplied by −1 and forwarded to the second logical operator 27. If the selection signal $\delta$ is "1", the weight factor W[n] is multiplied by +1, i.e. is left unchanged, and forwarded to the second logical operator 27. The second logical operator 27 receives the remainder $\varepsilon$ for evaluating. If the remainder is "1" since the integer represented by the portion $x_{abcd}[n]$ is odd, the second logical operator 27 outputs the by the first logical operator 26 adjusted weight factor W'[n]. If the remainder is "0" since the integer represented by the portion $x_{abcd}[n]$ is even, the weight factor W'[n] is multiplied by 0 and forwarded further. In this case the second logical operator 27 outputs "0".

The switching block 12 further comprises a weight accumulator 28 provided for accumulating successive adjusted weight factors W'[n]. The weight accumulator 28 comprises a sum operator 29 and a storage 30. The sum operator 29 sums up the adjusted weight factor W'[n] coming from the second logical operator 27 and the accumulation $R_{n-1}$ of adjusted weight factors W'[n] from preceding clock periods outputted by the storage 30. The sum is then stored as new accumulation $R_{n-1}$ for the next clock period n+1 in the storage 30. The storage 30 receives the clock signal CLK for timed storing of the new accumulation $R_{n-1}$. Storing the new accumulation $R_{n-1}$ into the storage 30 is conducted later than selecting one of the preliminary sub-portions $x_{ab}[n]$, $x_{cd}[n]$ by the selector 23. The storage 30 forwards the accumulation $R_{n-1}$ of adjusted weight factors W'[n] to the selector 23 for the subsequent clock period n+1.

Figure 5:
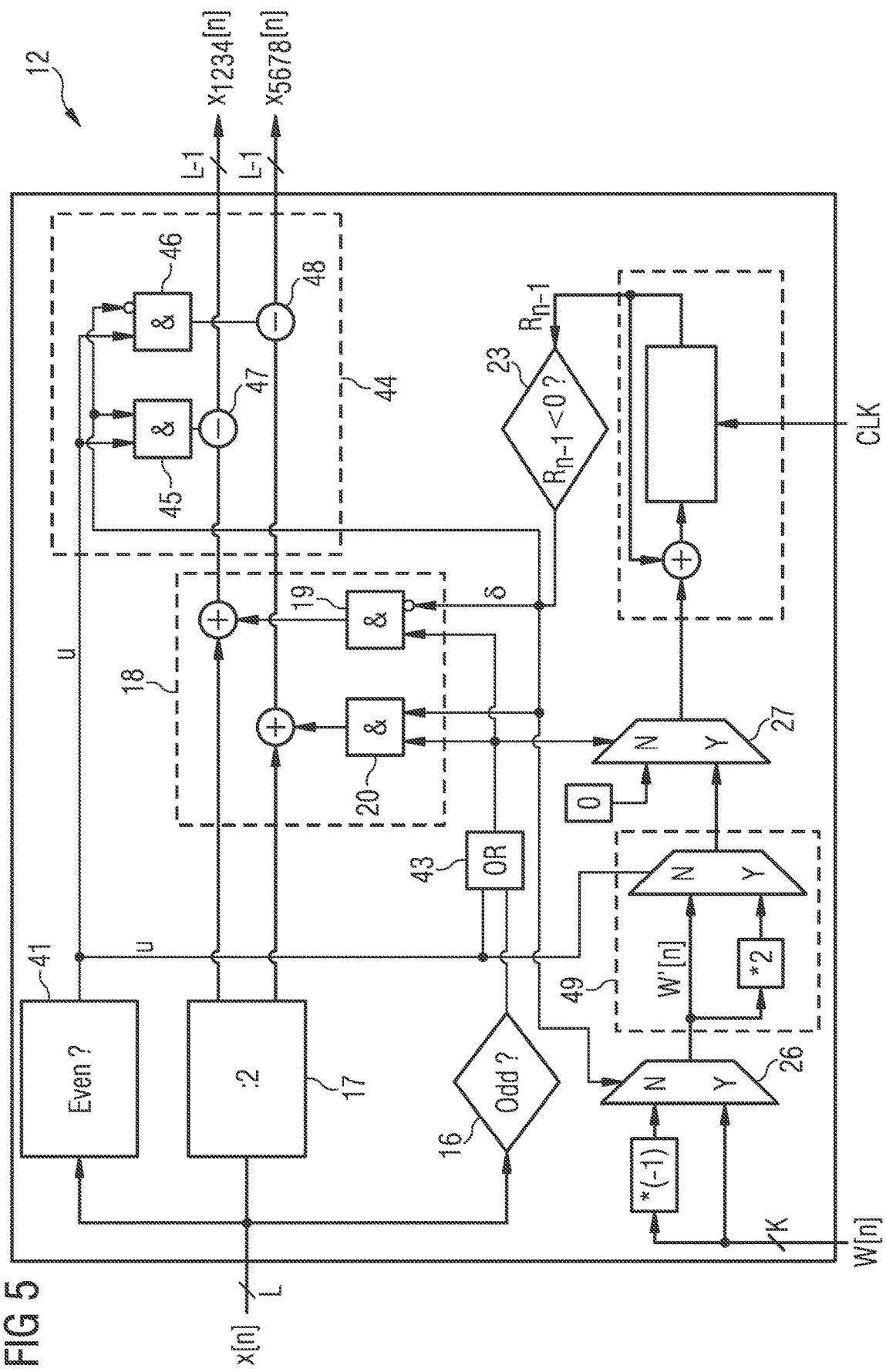
FIG. 5 shows a schematic of a switching block according to another embodiment of a digital-to-analog converter.

In FIG. 5 a schematic of another exemplary switching block 12 according to an embodiment of the DAC 4 is shown. In particular, the switching block 12 of FIG. 5 can be the switching block 12 of the first layer $L_1$ of the mismatch shaping logic block 8 receiving the multi-bit word x[n].

The switching block 12 of FIG. 5 is different from the switching block 12 of FIG. 4 in that it further comprises a further detector 41 receiving the multi-bit word. In one embodiment the further detector 41 detects sequences of multi-bit words x[n] representing even integers, which are not the minimum or maximum integer within the range of integers. In another embodiment the further detector 41 detects multi-bit words x[n] representing even integers, which are not the minimum or maximum integer within the range of integers, and further comprises a ditherer 42 determining by random how to split the detected multi-bit word. The further detector 41 outputs "0" or "1" depending on the detection. The outputted signal is denoted as a unit u. The further detector 41 is described in more detail in FIG. 6.

The switching block 12 of FIG. 5 differs from FIG. 4 also in comprising an OR-gate 43. The first input terminal of the OR-gate 43 is connected to an output of the further detector 41. The second input terminal is connected to the detector 16. The output terminal of the OR-gate 43 is connected to respective input terminals of the AND-gates 19, 20 of the adder 18. This means that in this embodiment the adder 18 is also configured to add the unit u outputted by the further detector 41 to one of the two preliminary sub-portions $x_{1234}[n]$ or $x_{5678}[n]$ generated by the divider 17.

Furthermore, the switching block 12 of FIG. 5 comprises a subtractor 44. The subtractor 44 is configured to subtract the unit u from the other one of the two preliminary sub-portions $x_{1234}[n]$ or $x_{5678}[n]$, respectively. The subtractor 44 comprises a first AND-gate 45 and a second AND-gate 46. One of the input terminals of the second AND-gate 46 is inverted. The outputted unit u of the further detector 41 is forwarded to one input terminal each of both AND-gates 45, 46, which is not inverted. The subtractor 44 further comprises a first difference operator 47 configured to subtract the unit u from the first preliminary sub-portion $x_{1234}$[n]. The output of the first AND-gate 45 is connected to the first difference operator 47. The subtractor 44 further comprises a second difference operator 48 configured to subtract the unit u from the second preliminary sub-portion $x_{5678}$[n]. The output of the second AND-gate 20 is connected to the second difference operator 48.

The outputted selection signal δ of the selector 23 is forwarded to the other respective input terminals of the AND-gates 45, 46 of the subtractor 44. Thus, the selection signal δ is forwarded to the inverted input terminal of the second AND-gate 46 and to the second input terminal of the first AND-gate 45, which is not inverted.

The switching block 12 of FIG. 5 also comprises a third logical operator 49 arranged between the first logical operator 26 and the second logical operator 27. The third logical operator 49 is connected to the output of the further detector 41, i.e. the unit u, for evaluating. If the unit u is "0", the adjusted weight factor W'[n] coming from the first logical operator 26 is multiplied by 1, i.e. is left unchanged, and forwarded to the second logical operator 27. If the unit u is "1", the adjusted weight factor W'[n] coming from the first logical operator 26 is multiplied by 2 and forwarded to the second logical operator 27.

In FIG. 6a a flow chart of the logical operation of the further detector 41 according to one embodiment is shown. This embodiment refers to a further detector 41, which detects sequences of multi-bit words x[n] representing even integers, which are not the minimum or maximum integer within the range of integers.

The further detector 41 receives the multi-bit word x[n]. In the first step it is checked whether the multi-bit word represents an even integer. If the multi-bit word x[n] does not represent an even integer, a counter EvenCNT, which initially has the value 0, is reset to 0 and the further detector 41 outputs "0", leading to equal splitting. If the multi-bit word x[n] represents an even integer, the counter is incremented by 1. In the latter case it is checked in a second step, whether the counter EvenCNT is larger than a parameter CNTLimit. For example, the parameter CNTLimit can be 1, if each second multi-bit word x[n] of a detected sequence shall be split into portions of unequal value. If the counter EvenCNT is less than or equal to the parameter CNTLimit, the further detector 41 outputs "0". Otherwise, it is checked in a third step if the integer represented by the multi-bit word x[n] is smaller than the maximum and larger than the minimum integer of the range of integers. If so, the further detector 41 outputs "1", leading to unequal splitting. Otherwise, the further detector 41 outputs "0". The order of the second and third step can be reversed without impacting the overall result. The third step could alternatively also be executed before the first step without significantly impacting the overall performance.

In FIG. 6b a flow chart of the logical operation of the further detector 41 according to another embodiment is shown. This embodiment refers to a further detector 41, which detects multi-bit words x[n] representing even integers, which are not the minimum or maximum integer within the range of integers and where a ditherer 42 determines by random how to split the detected multi-bit word.

The further detector 41 receives the multi-bit word x[n]. In the first step it is checked whether the multi-bit word x[n] represents an even integer. If the multi-bit word x[n] does not represent an even integer the further detector 41 outputs "0". Otherwise, a ditherer 42 determines by random how to split the multi-bit word x[n], i.e. to split it into two sub-portions of equal or unequal value. The ditherer 42 can be a random number generator generating random numbers from 0 to 1. If the random number is smaller than 0.5 the further detector 41 outputs "0", leading to equal splitting. Otherwise, it is checked in a next step if the integer represented by the multi-bit word x[n] is smaller than the maximum and larger than the minimum integer of the range of integers. If so, the further detector 41 outputs "1", leading to unequal splitting. Otherwise, the further detector 41 outputs "0". The steps can be rearranged in their order without affecting the overall functionality.

Figure 7:
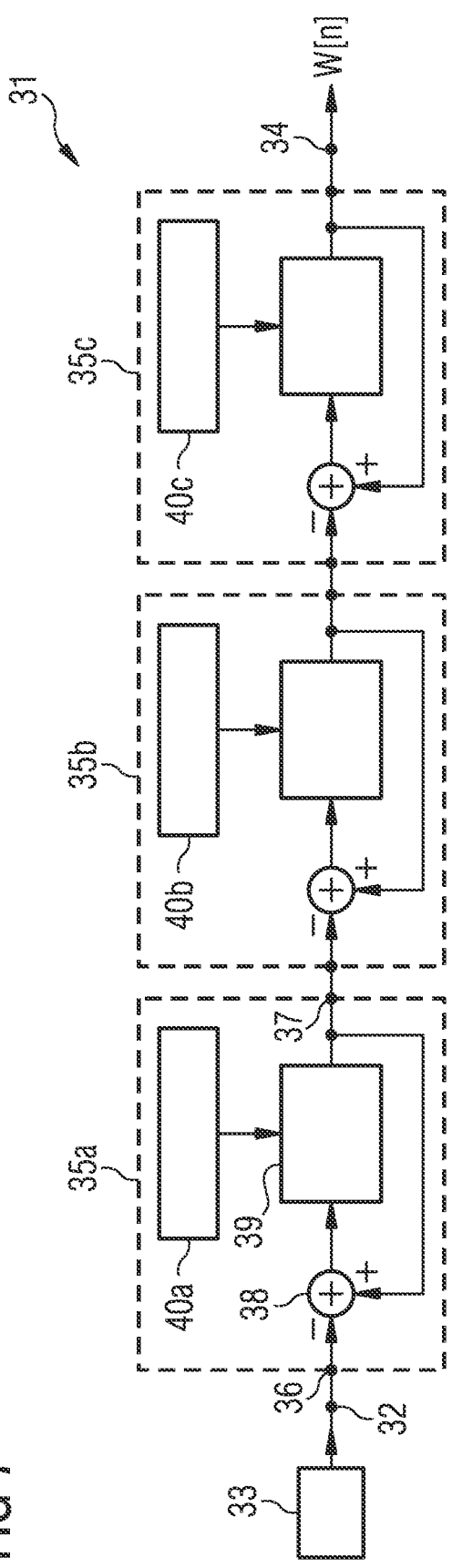
FIG. 7 shows a schematic of a weight generator according to an embodiment of a digital-to-analog converter, DAC.

In FIG. 7 a schematic of a weight generator 31 according to an embodiment of the DAC 4 is shown. The weight generator 31 shown in FIG. 7 represents a preferred embodiment of a weight generator 31. However, different embodiments are likewise possible. For example, the weight generator 31 may comprise a memory element (not shown), where different weight factors W[n] are stored.

The weight generator 31 of FIG. 7 comprises a generator input 32 for receiving a digital starting factor 33. The starting factor 33 can be provided by an extern hardware or extern software or it can be hardcoded in an integration register within the weight generator. The starting factor is required for successive calculating of monotonically decreasing weight factors W[n] for each clock period n. For that, the weight generator 31 comprises a generator output 34 forwarding the weight factor W[n] to the second input 14 of the switching block 12.

The weight generator 31 of FIG. 7 comprises three integration stages 35a-c coupling the generator input to the generator output. Each integration stage 35 comprises a stage input 36, as denoted for the first integration stage 35a. The stage input 36 receives a digital input signal from the generator input 32 or from a preceding integration stage 35, respectively. Furthermore, each integration stage 35 comprises a stage output 37, as also denoted for the first integration stage 35a. The stage output 37 provides a digital output signal for a subsequent integration stage 35 or the generator output 34, respectively. This means that the digital output signal of the last integration stage 35c is the weight factor W[n]. Each integration stage 35 further comprises a stage combiner 38 configured to combine the digital input signal and a feedback from the digital output signal. A stage combiner 38 is denoted for the first integration stage 35a. In particular, the stage combiner 38 subtracts the digital input signal from the feedback from the digital output signal. Each integration stage 35 further comprises a register 39 configured to process the combination of the digital input signal and the feedback from the digital output signal. The register 39 provides the respective digital output signal of each integration stage 25. Each register receives a register factor 40a-c. The register factors 40a-c may be required for the first clock period n=1 within the conversion cycle of the iADC 1 in order to initialize the registers 39 with a start value. The register factors 40a-c can be derived by the starting factor 33 and the condition that the weight factor W[n] of the last clock period n=OSR within the conversion cycle of the iADC 1 has to be 1. For each new conversion cycle of the iADC 1, i.e. for each clock period n=1, the registers 39 of each integration stage 35 may be re-initialized. However, re-initialization may also take place at other time intervals. For example, re-initialization takes place every X-th conversion cycle. For example, the registers 39 can be re-initialized after each second or third conversion cycle. The exact time of re-initialization has no significant influence on the functionality of the iADC.

Figure 8:
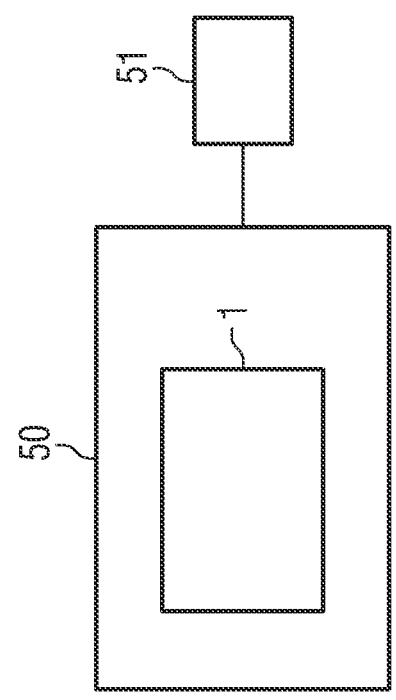
FIG. 8 shows schematic of an electronic device according to an embodiment.

FIG. 8 shows a schematic diagram of an exemplary embodiment of an electronic device (50) comprising the iADC (1) and being connected to at least one sensor (51). The iADC (1) is configured to perform an analog-to-digital conversion of a signal provided by the at least one sensor (51).

The embodiments of the DAC disclosed herein have been discussed for the purpose of familiarizing the reader with novel aspects of the idea. Although preferred embodiments have been shown and described, many changes, modifications, equivalents and substitutions of the disclosed concepts may be made by one having skill in the art without unnecessarily departing from the scope of the claims.

It will be appreciated that the disclosure is not limited to the disclosed embodiments and to what has been particularly shown and described hereinabove. Rather, features recited in separate dependent claims or in the description may advantageously be combined. Furthermore, the scope of the disclosure includes those variations and modifications, which will be apparent to those skilled in the art and fall within the scope of the appended claims.

The term "comprising", insofar it was used in the claims or in the description, does not exclude other elements or steps of a corresponding feature or procedure. In case that the terms "a" or "an" were used in conjunction with features, they do not exclude a plurality of such features. Moreover, any reference signs in the claims should not be construed as limiting the scope.

The invention claimed is:

1. A digital-to-analog converter, DAC, for use in an incremental analog-to-digital converter, iADC, the DAC being configured for converting a multi-bit word to an analog feedback signal, the multi-bit word representing an integer within a range of integers, the DAC comprising
   a mismatch shaping logic block configured to generate a selection vector with a predefined number of bits based on the multi-bit word,
   a plurality of output elements configured to generate respective analog portions based on the selection vector, and
   a signal combiner for combining the analog portions to the analog feedback signal,
   wherein in the mismatch shaping logic block
   a predetermined number of switching blocks are arranged cascaded,
   each switching block is configured to receive at least a portion of the multi-bit word, to split the portion into two sub-portions and to forward each sub-portion to one further subsequent switching block or to one of the output elements, respectively,
   in each switching block a weight factor is adjusted by multiplying the weight factor with the difference of the two sub-portions, and
   each switching block comprises a weight accumulator provided for accumulating successive adjusted weight factors, wherein the way of splitting the portion of a further multi-bit word coming to the respective switching block at a subsequent clock period within the conversion cycle of the iADC is determined based on the sign of the weight accumulator.

2. The DAC according to claim 1, wherein in each clock period within the conversion cycle of the iADC, a new weight factor is provided, wherein successive weight factors decrease according to a monotonically decreasing function.

3. The DAC according to claim 1, wherein each switching block further comprises
   a divider configured to split the portion of the multi-bit word into two preliminary sub-portions with equal value,
   a selector configured to select one of the preliminary sub-portions, the selection being based on the sign of the weight accumulator, and
   an adder configured to add a remainder of the splitting conducted by the divider to the preliminary sub-portion selected by the selector.

4. The DAC according to claim 1, wherein each switching block further comprises
   a first input for receiving the portion of the multi-bit word,
   a second input for providing the weight factors,
   a third input for providing a clock signal, the clock signal being provided for the weight accumulator to accumulate subsequent adjusted weight factors,
   a detector configured to detect, if an integer represented by the portion of the multi-bit word is even or odd,
   a divider configured to split the portion of the multi-bit word into two preliminary sub-portions, the preliminary sub-portions having a smaller absolute value than the portion of the multi-bit word,
   a selector configured to select one of the preliminary sub-portions, the selection being based on the sign of the weight accumulator, and
   an adder configured to add a remainder of the splitting conducted by the divider to the preliminary sub-portion selected by the selector,
   a first output for forwarding the first sub-portion,
   a second output for forwarding the second sub-portion.

5. The DAC according to claim 4, wherein in each switching block
   the divider is configured to split the portion of the multi-bit word into two preliminary sub-portions with equal value, and
   the adder is configured to add the remainder of the splitting conducted by the divider to the preliminary sub-portion selected by the selector.

6. The DAC according to claim 3, wherein in the first switching block receiving the multi-bit word,
   a further detector is configured to detect a sequence of multi-bit words representing even integers, which are larger than the minimum and smaller than the maximum integer within the range of integers, and
   for each r-th multi-bit word of the detected sequence, where r is a natural number, the adder is configured to add a unit to one of the two preliminary sub-portions and a subtractor is configured to subtract the unit from the other preliminary sub-portion, wherein the selector determines the respective preliminary sub-portions based on the sign of the weight accumulator.

7. The DAC according to claim 3, wherein in the first switching block receiving the multi-bit word,
   a further detector is configured to detect multi-bit words representing even integers, which are larger than the minimum and smaller than the maximum integer within the range of integers,
   a ditherer determines by random to split a multi-bit word detected by the further detector into two portions of equal or unequal value, respectively, and
   in case that the ditherer determined unequal splitting, the adder is configured to add a unit to one of the two preliminary sub-portions and a subtractor is configured to subtract the unit from the other preliminary sub-portion, wherein the selector determines the respective preliminary sub-portions based on the sign of the weight accumulator.

8. The DAC according to claim 1, the DAC further comprising a weight generator configured to provide successive weight factors for each clock period within the conversion cycle of the iADC, wherein the weight generator generates monotonically decreasing weight factors.

9. The DAC according to claim 8, wherein the weight generator comprises
  a generator input receiving a digital starting factor,
  a generator output providing the weight factor,
  at least one integration stage coupling the generator input to the generator output, the integration stage further comprising
    a stage input to receive a digital input signal from the generator input or from a preceding integration stage, respectively,
    a stage output to provide a digital output signal for a subsequent integration stage or the generator output, respectively,
    a stage combiner configured to combine the digital input signal and a feedback from the digital output signal, and
    a register configured to process the combination of the digital input signal and the feedback from the digital output signal, the register providing the digital output signal.

10. The DAC according to claim 8, wherein the weight generator forwards the respective weight factor for a given clock period of the conversion cycle to each switching block.

11. An incremental analog-to-digital converter, iADC, comprising a DAC according to claim 1, the iADC further comprising
  an input for providing an analog input signal,
  a combiner being configured to combine the analog input signal with the analog feedback signal from the DAC,
  a loop filter being configured for filtering a combination of the analog input signal and the analog feedback signal,
  an N-level quantizer for generating the multi-bit word based on an output of the loop filter,
  a feedback path comprising the DAC, the DAC being configured for converting the multi-bit word from the N-level quantizer to an analog feedback signal for the combiner of the iADC, and
  a decimation filter provided for filtering the multi-bit word to generate a digital system output signal.

12. An electronic device comprising the iADC according to claim 11, the electronic device further being connected to at least one sensor, wherein the iADC is configured to perform an analog-to-digital conversion of a signal provided by the at least one sensor.

13. A digital-to-analog conversion method for converting a multi-bit word representing an integer within a range of integers to an analog feedback signal of an incremental analog-to-digital converter, iADC, the digital-to-analog conversion method comprising
  generating a selection vector with a predefined number of bits based on the multi-bit word,
  generating, with a plurality of output elements, respective analog portions based on the selection vector,
  combining the analog portions to the analog feedback signal,
  wherein the generation of the selection vector comprises
    successive splitting of the multi-bit word into portions and sub-portions, respectively,
    adjusting of weight factors by multiplying the weight factors with the difference of two respective sub-portions, and
    accumulating successive adjusted weight factor, wherein the way of splitting portions of further multi-bit words at subsequent clock periods within the conversion cycle of the iADC is determined based on the sign of the accumulation of adjusted weight factors.

14. The method according to claim 13, further comprising:
  in each clock period within the conversion cycle of the iADC providing a new weight factor, wherein successive weight factors decrease according to a monotonically decreasing function.

15. The method according to claim 13, further comprising generating successive weight factors for each clock period within the conversion cycle of the iADC by use of a weight generator, the generation of weight factors further comprising
  receiving a digital starting factor at a generator input,
  providing at least one integration stage coupling the generator input to a generator output,
  at a stage input of the integration stage, receiving a digital input signal from the generator input or from a preceding integration stage,
  combining the digital input signal and a feedback from a digital output signal,
  at a stage output of the integration stage, providing the digital output signal by processing the combination of the digital input signal and the feedback from the digital output signal for a subsequent integration stage or the generator output, and
  providing the weight factors at the generator output.

16. The method according to claim 13, further comprising
  detecting, if the integer represented by the portion of the multi-bit word coming to a respective switching block is even or odd,
  splitting the portion of the multi-bit word into two preliminary sub-portions of equal value,
  selecting one preliminary sub-portion based on the sign of the accumulation of adjusted weight factors, and
  adding a remainder of the splitting to the selected preliminary sub-portion.

17. The method according to claim 13, in a first switching block receiving the multi-bit word
  further comprising
    detecting sequences of multi-bit words representing even integers, which are larger than the minimum and smaller than the maximum integer within the range of integers, and
    for each r-th multi-bit word of the detected sequence, where r is a natural number, adding a unit to one of the two preliminary sub-portions and subtracting the unit from the other preliminary sub-portion, wherein the respective preliminary sub-portions are selected based on the sign of the accumulation of adjusted weight factors.

18. The method according to claim 13, in the first switching block receiving the multi-bit word further comprising
  detecting multi-bit words representing even integers, which are larger than the minimum and smaller than the maximum integer within the range of integers,
  determining by random to split a detected multi-bit word representing an even integer into two portions of equal or unequal value, respectively, and
  in case of determination of unequal splitting, adding a unit to one of the two preliminary sub-portions and subtracting the unit from the other preliminary sub-portion, wherein the respective preliminary sub-portions are selected based on the sign of the accumulation of adjusted weight factors.

19. A digital-to-analog converter, DAC, for use in an incremental analog-to-digital converter, iADC, the DAC being configured for converting a multi-bit word to an analog feedback signal, the multi-bit word representing an integer within a range of integers, the DAC comprising
- a mismatch shaping logic block configured to generate a selection vector with a predefined number of bits based on the multi-bit word,
- a plurality of output elements configured to generate respective analog portions based on the selection vector, and
- a signal combiner for combining the analog portions to the analog feedback signal, wherein in the mismatch shaping logic block
- a predetermined number of switching blocks are arranged cascaded forming layers of switching blocks,
- each switching block is configured to receive at least a portion of the multi-bit word, to split the portion into two sub-portions and to forward each sub-portion, wherein switching blocks of preceding layers are configured to forward the sub-portions to one further switching block of a subsequent layer and switching blocks of a last layer are configured to forward the sub-portions to one of the output elements,
- in each switching block a weight factor is adjusted by multiplying the weight factor with the difference of the two sub-portions, wherein in each clock period within the conversion cycle of the iADC a new weight factor is provided by a weight generator, wherein successive weight factors decrease according to a monotonically decreasing function, and
- each switching block comprises a weight accumulator provided for accumulating successive adjusted weight factors, wherein the way of splitting the portion of a further multi-bit word coming to the respective switching block at a subsequent clock period within the conversion cycle of the iADC is determined based on the sign of the weight accumulator.

20. The DAC according to claim 19, the DAC further comprising a weight generator, wherein the weight generator is re-initialized at predetermined time intervals.

\* \* \* \* \*